United States Patent
Stan et al.

(10) Patent No.: US 7,727,795 B2
(45) Date of Patent: Jun. 1, 2010

(54) EXPONENTIALLY DOPED LAYERS IN INVERTED METAMORPHIC MULTIJUNCTION SOLAR CELLS

(75) Inventors: Mark A. Stan, Albuquerque, NM (US); Arthur Cornfeld, Sandia Park, NM (US); Vance Ley, Albuquerque, NM (US)

(73) Assignee: Encore Solar Power, Inc., Albuquerque, NM (US)

( * ) Notice: Subject to any disclaimer, the term of this patent is extended or adjusted under 35 U.S.C. 154(b) by 0 days.

(21) Appl. No.: 12/187,454

(22) Filed: Aug. 7, 2008

(65) Prior Publication Data

US 2009/0155951 A1      Jun. 18, 2009

Related U.S. Application Data

(62) Division of application No. 11/956,069, filed on Dec. 13, 2007.

(51) Int. Cl.
*H01L 21/00* (2006.01)
(52) U.S. Cl. .............................. 438/82; 438/99; 257/40; 257/E33.001; 257/E25.008; 257/E51.018; 313/506; 313/509; 428/690; 359/238; 359/242
(58) Field of Classification Search ................. 438/46, 438/47, 93, 94, 82, 99; 257/E31.001, E31.021, 257/40, E25.008, E51.018, E51.001, E33.001; 136/252, 262; 313/499–509; 428/690, 917; 359/238, 242
See application file for complete search history.

(56) References Cited

U.S. PATENT DOCUMENTS

| | | | |
|---|---|---|---|
| 4,001,864 A | 1/1977 | Gibbons | |
| 4,255,211 A | 3/1981 | Fraas | |
| 4,338,480 A | 7/1982 | Antypas et al. | |
| 4,612,408 A | 9/1986 | Moddel et al. | |
| 4,881,979 A | 11/1989 | Lewis | |

(Continued)

FOREIGN PATENT DOCUMENTS

EP          0 658 944 B1      4/2009

(Continued)

OTHER PUBLICATIONS

Streit et al., "Effect of exponentially Graded Base Doping on the Performance of GaAs/AlGaAs Heterojunction Bipolar Transistor", IEEE Electron Device Letter, vol. 12, No. 5, May 1991.*

(Continued)

*Primary Examiner*—Hsien-ming Lee

(57) ABSTRACT

A method of forming a multijunction solar cell including an upper subcell, a middle subcell, and a lower subcell, including providing first substrate for the epitaxial growth of semiconductor material; forming a first solar subcell on the substrate having a first band gap; forming a second solar subcell over the first solar subcell having a second band gap smaller than the first band gap; forming a grading interlayer over the second subcell, the grading interlayer having a third band gap greater than the second band gap; and forming a third solar subcell over the grading interlayer having a fourth band gap smaller than the second band gap such that the third subcell is lattice mis-matched with respect to the second subcell, wherein at least one of the bases of a solar subcell has an exponentially doped profile.

16 Claims, 18 Drawing Sheets

U.S. PATENT DOCUMENTS

| | | | |
|---|---|---|---|
| 5,019,177 | A | 5/1991 | Wanlass et al. |
| 5,021,360 | A | 6/1991 | Melman et al. |
| 5,053,083 | A | 10/1991 | Sinton et al. |
| 5,217,539 | A | 6/1993 | Fraas et al. |
| 5,322,572 | A | 6/1994 | Wanlass et al. |
| 5,342,453 | A | 8/1994 | Olson |
| 5,376,185 | A | 12/1994 | Wanlass |
| 5,479,032 | A | 12/1995 | Forrest et al. |
| 5,944,913 | A | 8/1999 | Hou et al. |
| 6,180,432 | B1 | 1/2001 | Freeouf |
| 6,239,354 | B1 | 5/2001 | Wanlass et al. |
| 6,252,287 | B1 | 6/2001 | Kurtz et al. |
| 6,281,426 | B1 | 8/2001 | Olson et al. |
| 6,300,557 | B1 | 10/2001 | Wanlass et al. |
| 6,300,558 | B1 | 10/2001 | Takamoto et al. |
| 6,340,788 | B1 | 1/2002 | King et al. |
| 6,482,672 | B1 | 11/2002 | Hoffman et al. |
| 6,660,928 | B1 | 12/2003 | Patton et al. |
| 6,951,819 | B2 | 10/2005 | Iles et al. |
| 7,071,407 | B2 | 7/2006 | Fatemi et al. |
| 2002/0117675 | A1 | 8/2002 | Mascarenhas |
| 2004/0200523 | A1 | 10/2004 | King et al. |
| 2006/0021565 | A1 | 2/2006 | Zahler et al. |
| 2006/0144435 | A1* | 7/2006 | Wanlass ............ 136/249 |
| 2006/0162768 | A1 | 7/2006 | Wanlass |
| 2007/0218649 | A1 | 9/2007 | Hernandez |
| 2007/0272946 | A1 | 11/2007 | Pagette |
| 2007/0277873 | A1* | 12/2007 | Cornfeld et al. ........ 136/255 |
| 2008/0185038 | A1 | 8/2008 | Sharps |
| 2008/0245409 | A1 | 10/2008 | Varghese et al. |

FOREIGN PATENT DOCUMENTS

| | | |
|---|---|---|
| FR | 2 878 076 A1 | 5/2006 |
| WO | WO 2005/015638 A1 | 2/2005 |

OTHER PUBLICATIONS

Lattice-Mismatched Approaches for High-Performance, III-V Photovoltaic Energy Converters, M.W. Wanlass et al., 2005 IEEE, pp. 530-535.

An Inverted-Growth Approach to Development of an IR-Transparent, High-Efficiency AlGaAs/GaAs Cascade Solar Cell, R. Venkatasubramanian, et al., Research Triangel Institute, 1991 IEEE, pp. 93-98.

Wolf, M. "Drift Fields in Photovoltaic Solar Energy Converter Cells." Proceedings of the IEEE, vol. 51, No. 5, 1963. pp. 674-693. IEEE, Piscataway, NJ.

Fahrenbruch, A.L., et al. Fundamentals of Solar Cells: Photovoltaic Solar Energy Conversion. pp. 280-283. 1983. Academic Press, New York, NY.

R. Venkatasubramanian, et al., "An Inverted-Growth Approach to Development of an IR-Transparent, High-Efficiency AlGaAs/GaAs Cascade Solar Cell." 22$^{nd}$ IEEE Photovoltaic Specialists Conference, Oct. 7-11, 1991, Las Vegas, NV, USA.

M. Yamaguchi, "Physics and Technologies of Superhigh-Efficiency Tandem Solar Cells." Semiconductors, vol. 33, No. 9, Sep. 1999, pp. 961-964. Toyota Technological Institute, Nagoya, Japan. ©1999, American Institute of Physics.

R.R. King, et al., "Next-Generation, High-Efficiency III-V Multijunction Solar Cells." 28$^{th}$ IEEE Photovoltaic Specialists Conference, Sep. 15-22, 2000, Anchorage, AK, USA.

S. Sinharoy, et al., "Progress in the Development of Metamorphic Multi-junction III-V Space Solar Cells." Progress in Photovoltaics: Research and Applications, vol. 10, Feb. 2002, pp. 427-432. John Wiley & Sons, Ltd. Hoboken, NJ, USA.

R.R. King, et al., "High-Efficiency Space and Terrestrial Multijunction Solar Cells Through Bandgap Control in Cell Structures." 2002 Photovoltaic Specialists Conference, Conference Record of the 29$^{th}$ IEEE, May 19-24, 2002, pp. 776-781. New Orleans, LA, USA.

Messenger, R.A. Photovoltaic Systems Engineering. Second Edition, 2004. pp. 364-365. CRC Press, Boca Raton, FL.

M.W. Wanlass et al., "Lattice-Mismatched Approached for High-Performance, III-V Photovoltaic Energy Converters." Proceedings of the 31$^{st}$ IEEE PVSC, Jan. 3-7, 2005, Lake Buena Vista, FL, USA.

Takamoto, T., et al., "InGaP/GaAS-based Multijunction Solar Cells." Progress in Photovoltaics: Research and Application, 2005; vol. 13, pp. 495-511. Wiley InterScience, John Wiley & Sons, Ltd., Hoboken, NJ.

M.W. Wanlass et al., "Monolithic, Ultra-Thin GaInP/GaAs/GaInAs Tandem Solar Cells." 2006 IEEE 4$^{th}$ World Conference on Photovoltaic Energy Conversion, May 7-12, 2006, Waikoloa, Hawaii, USA.

D.J. Friedman, et al., "0.7-eV GaInAs Junction for a GaInP/GaAs/GaInAs(1eV)/GaInAs(0.7eV) Four-Junction Solar Cell." 2006 IEEE 4$^{th}$ World Conference on Photovoltaic Energy Conversion, May 7-12, 2006, Waikoloa, Hawaii, USA.

J.F. Geisz, et al., "High-efficiency GaInP/GaAs/InGaAs triple-junction solar cells grown inverted with a metamorphic bottom junction." Applied Phyics Letters 91, 023502 (2007), pp. 023502-1-02305.3. Online publication Jul. 10, 2007. American Institute of Physics, Melville, NY, USA.

P. Sharps, et al., "Inverting the triple junction improves efficiency and flexibility." Compound Semiconductor. Oct. 2007, pp. 25-28. IOP Publishing, Ltd., Bristol, England.

H. Yoon, et al., "Progress of Inverted metamorphic III-V Solar Cell Development at Spectrolab." 33$^{rd}$ IEEE Photovoltaic Specialists Conference, May 11-16, 2008, San Diego, CA, USA.

J.F. Geisz, et al., "Inverted GaInP / (In)GaAs / InGaAs Triple-Junction Solar Cells with Low-Stress Metamorphic Bottom Junctions." 33$^{rd}$ IEEE Photovoltaic Specialists Conference, May 11-16, 2008, San Diego, CA, USA.

A. Cornfeld, et al., "Development of a Large Area Inverted Metamorphic Multi-junction (IMM) Highly Efficient AM0 Solar Cell." 33$^{rd}$ IEEE Photovoltaic Specialists Conference, May 11-16, 2008, San Diego, CA, USA.

A. Cornfeld, et al., "Development of a Large Area Inverted Metamorphic Multi-junction Highly Efficient AM0 Solar Cell." Conference paper presented at the 33$^{rd}$ IEEE Photovoltaic Specialists Conference May 11-16, 2008 on May 12, 2008. San Diego, CA, USA. 17 pages.

M. Stan, et al., "Very High Efficiency Triple Junction Solar Cells by MOVPE." 14$^{th}$ International Conference of Metalorganic Vapor Phase Epitaxy. Jun. 1-6, 2008, Metz, France.

A. Cornfeld, et al., "Advances in the Performance of Inverted Metamorphic Multi-junction Solar Cells." 23$^{rd}$ European Photovoltaic Energy Conference, Sep. 1-5, 2008, Valencia, Spain.

"Partial European Search Report," Application No. EP 08 01 3466. Feb. 12, 2009. European Patent Office, Berlin. Germany.

Green, M.A. "Do Built-in Fields Improve Solar Cell Performance?" Progress in Photovoltaics: Research and Applications. 2009, 17: 57-66. John Wiley & Sons, Inc., New York, NY.

Würfel, P. Physics of Solar Cells: from Basic Principles to Advanced Concepts. 2nd updated and expanded edition, 2009. ISBN 978-3-527-40857-6. Sections 6.4 and 6.8 17 pages. Wiley-VCH: Weinheim, Germany.

Schultz, J.C., et al., "Development of High-Quantum-Efficiency, Lattice-Mismatched, 1.0-eV GaInAs Solar Cells." Journal of Electronic Materials, vol. 22, No. 7, Jul. 1993. pp. 755-761. The Minerals, Metals, & Materials Society (TMS)/IEEE. Springer New York, New York, NY.

* cited by examiner

EXPONENTIALLY DOPED LAYERS IN INVERTED METAMORPHIC MULTIJUNCTION SOLAR CELLS

REFERENCE TO RELATED APPLICATIONS

This application is a divisional patent application of U.S. patent application Ser. No. 11/956,069, filed on Dec. 13, 2007 (pending).

This application is related to co-pending U.S. patent application Ser. Nos. 11/860,142 and 11/860,183 filed Sep. 24, 2007.

This application is related to co-pending U.S. patent application Ser. No. 11/836,402 filed Aug. 8, 2007.

This application is also related to co-pending U.S. patent application Ser. No. 11/616,596 filed Dec. 27, 2006.

This application is also related to co-pending U.S. patent application Ser. No. 11/445,793 filed Jun. 2, 2006.

GOVERNMENT RIGHTS STATEMENT

This invention was made with government support under Contract No. FA9453-06-C-0345 awarded by the U.S. Air Force. The Government has certain rights in the invention.

BACKGROUND OF THE INVENTION

1. Field of the Invention

The present invention relates to the field of solar cell semiconductor devices, and particularly to multijunction solar cells including a metamorphic layer. Such devices also include solar cells known as inverted metamorphic solar cells.

2. Description of the Related Art

Photovoltaic cells, also called solar cells, are one of the most important new energy sources that have become available in the past several years. Considerable effort has gone into solar cell development. As a result, solar cells are currently being used in a number of commercial and consumer-oriented applications. While significant progress has been made in this area, the requirement for solar cells to meet the needs of more sophisticated applications has not kept pace with demand. Applications such as satellites used in data communications have dramatically increased the demand for solar cells with improved power and energy conversion characteristics.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Solar cells are often fabricated in vertical, multijunction structures, and disposed in horizontal arrays, with the individual solar cells connected together in a series. The shape and structure of an array, as well as the number of cells it contains, are determined in part by the desired output voltage and current.

Inverted metamorphic solar cell structures such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005) present an important starting point for the development of future commercial high efficiency solar cells. The structures described in such prior art present a number of practical difficulties relating to the appropriate choice of materials and fabrication steps.

Prior to the present invention, the materials and fabrication steps disclosed in the prior art have various drawbacks and disadvantages in producing a commercially viable inverted metamorphic multifunction solar cell using commercially established fabrication processes.

SUMMARY OF THE INVENTION

The present invention in one embodiment provides a method of forming a multijunction solar cell comprising an upper subcell, a middle subcell, and a lower subcell, the method comprising: providing first substrate for the epitaxial growth of semiconductor material; forming a first solar subcell having a base and an emitter on said substrate having a first band gap; forming a second solar subcell having a base and an emitter over said first solar subcell having a second band gap smaller than said first band gap; forming a grading interlayer over said second subcell, said grading interlayer having a third band gap greater than said second band gap; and forming a third solar subcell having a base and an emitter over said grading interlayer having a fourth band gap smaller than said second band gap such that said third subcell is lattice mismatched with respect to said second subcell, wherein at least one of the bases has an exponentially doped profile.

In another aspect, the present invention provides an embodiment of a method of manufacturing a solar cell by providing a first substrate, depositing on the first substrate a sequence of layers of semiconductor material forming a solar cell, including at least one base layer with exponential doping; mounting a surrogate substrate on top of the sequence of layers; and removing the first substrate.

In another aspect the present invention provides an embodiment of a method of manufacturing a solar cell by providing a first substrate, depositing on the first substrate a sequence of layers of semiconductor material forming a solar cell, including at least one base layer with exponential doping; mounting a surrogate substrate on top of the sequence of layers; and removing the first substrate. In another aspect, the present invention provides A method for forming a solar cell comprising forming a top cell including base and emitter layers composed of InGaP semiconductor material; forming a middle cell emitter layer of InGaP semiconductor material and a base layer of GaAs semiconductor material; and forming a bottom cell including an emitter and base layer of InGaAs semiconductor material, wherein at least one of the bases has an exponentially doped profile.

Some implementations or embodiments may incorporate or implement fewer of the aspects or features noted in the foregoing summaries.

BRIEF DESCRIPTION OF THE DRAWINGS

The invention will be better and more fully appreciated by reference to the following detailed description when considered in conjunction with the accompanying drawings, wherein.

DESCRIPTION OF THE PRIOR ART AND PREFERRED EMBODIMENT

Figure 1:
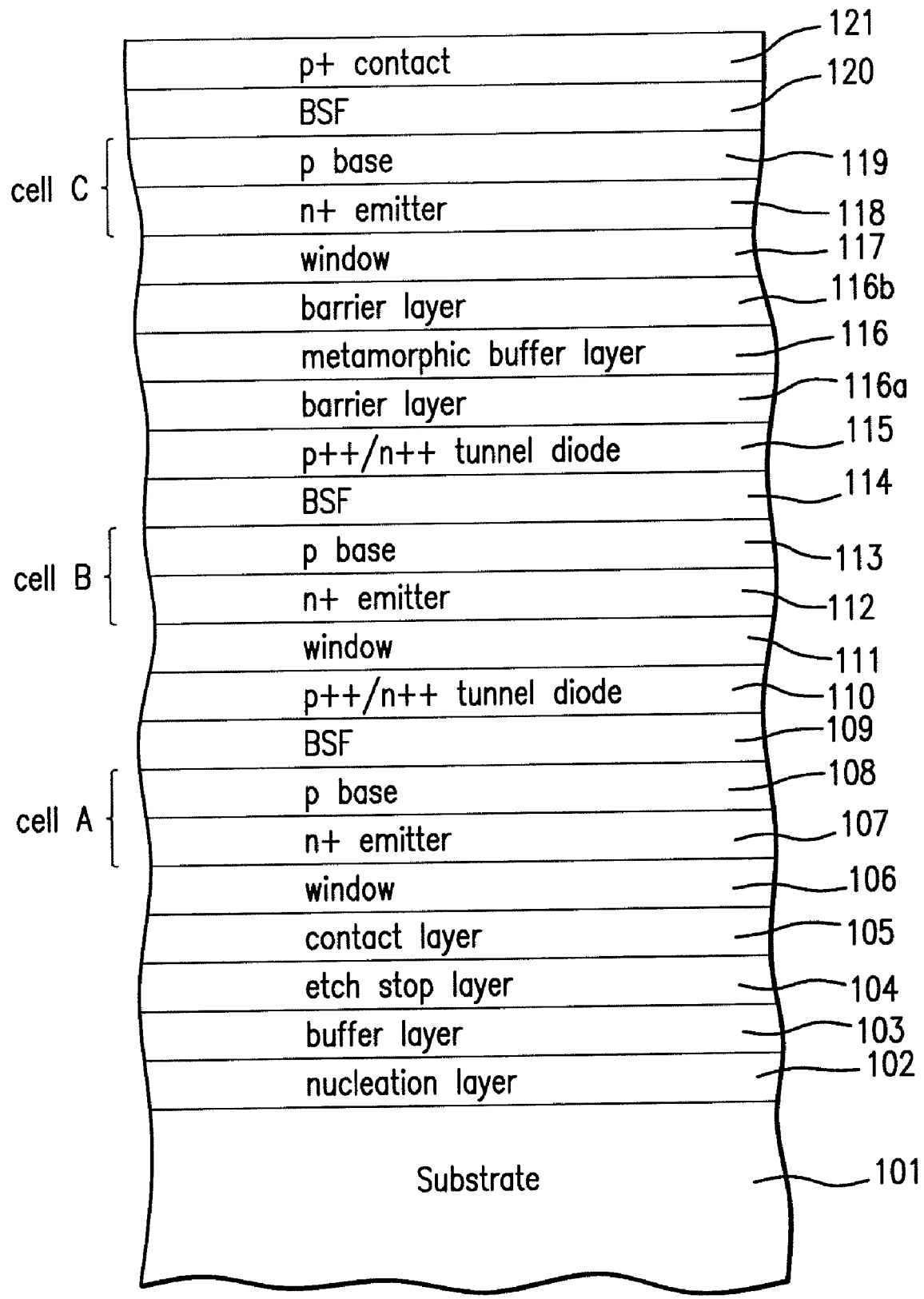
FIG. 1 is an enlarged cross-sectional view of a solar cell constructed according to one embodiment of the present invention.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 depicts the multijunction solar cell according to one embodiment of the present invention after formation of the three subcells A, B and C on a substrate. More particularly, there is shown a substrate 101, which may be either gallium arsenide (GaAs), germanium (Ge), or other suitable material. In the case of a Ge substrate, a nucleation layer 102 is deposited on the substrate. On the substrate, or over the nucleation layer 102, a buffer layer 103, and an etch stop layer 104 are further deposited. A contact layer 105 is then deposited on layer 104, and a window layer 106 is deposited on the contact layer. The subcell A, consisting of an n+ emitter layer 107 and a p-type base layer 108, is then deposited on the window layer 106.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In the preferred embodiment, the emitter layer 107 is composed of InGa(Al)P and the base layer 108 is composed of InGa(Al)P. The aluminum or Al term in parenthesis in the preceding formula means that Al is an optional constituent, and in this instance may be used in an amount ranging from 0% to 30%. The doping profile of the emitter and base layers 107 and 108 according to one embodiment of the present invention will be discussed in conjunction with FIG. 16.

On top of the base layer 108 is deposited a back surface field ("BSF") layer 109 used to reduce recombination loss.

The BSF layer 109 drives minority carriers from the region near the base/BSF interface surface to minimize the effect of recombination loss. In other words, a BSF layer 109 reduces recombination loss at the backside of the solar subcell A and thereby reduces the recombination in the base.

On top of the BSF layer 109 is deposited a sequence of heavily doped p-type and n-type layers 110 which forms a tunnel diode which is a circuit element to connect subcell A to subcell B.

On top of the tunnel diode layers 110 a window layer 111 is deposited. The window layer 111 used in the subcell B also operates to reduce the recombination loss. The window layer 111 also improves the passivation of the cell surface of the underlying junctions. It should be apparent to one skilled in the art, that additional layer(s) may be added or deleted in the cell structure without departing from the scope of the present invention.

On top of the window layer 111 the layers of subcell B are deposited: the emitter layer 112, and the p-type base layer 113. These layers are preferably composed of InGaP and $In_{0.015}GaAs$ respectively, (for a Ge growth template) although any other suitable materials consistent with lattice constant and band gap requirements may be used as well. The doping profile of layers 112 and 113 according to one embodiment of the present invention will be discussed in conjunction with FIG. 16.

On top of the cell B is deposited a BSF layer 114 which performs the same function as the BSF layer 109. A p++/n++ tunnel diode 115 is deposited over the BSF layer 114 similar to the layers 110, again forming a circuit element to connect subcell B to subcell C.

A barrier layer 116a, preferably composed of InGa(Al)P, is deposited over the tunnel diode 115, to a thickness of about 1.0 micron. Such barrier layer is intended to prevent threading dislocations from propagating, either opposite to the direction of growth into the middle and top subcells B and C, or in the direction of growth into the bottom subcell A, and are more particularly described in copending U.S. patent application Ser. No. 11/860,183, filed Sep. 24, 2007.

A metamorphic layer (grading interlayer) 116 is deposited over the barrier layer 116a. Layer 116 is preferably a compositionally step-graded series of InGaAlAs layers with monotonically changing lattice constant that is intended to achieve a transition in lattice constant from subcell B to subcell C. The band gap of layer 116 is preferably 1.5 ev consistent with a value slightly greater than the band gap of the middle subcell B.

In one embodiment, as suggested in the Wanlass et al. paper, the step grade contains nine compositionally graded InGaP steps with each step layer having a thickness of 0.25 micron. In the preferred embodiment, the layer 116 is composed of InGaAlAs, with monotonically changing lattice constant.

In another embodiment of the present invention, an optional second barrier layer 116b may be deposited over the InGaAlAs metamorphic layer 116. The second barrier layer 116b will typically have a slightly different composition than that of barrier layer 116a.

A window layer 117 is deposited over the barrier layer 116b, this window layer operating to reduce the recombination loss in subcell "C". It should be apparent to one skilled in the art that additional layers may be added or deleted in the cell structure without departing from the scope of the present invention.

On top of the window layer 117, the layers of cell C are deposited: the n+ emitter layer 118, and the p-type base layer 119. These layers are preferably composed of InGaAs, although an other suitable materials consistent with lattice constant and band gap requirements may be used as well. The doping profile of layers 118 and 119 will be discussed in connection with FIG. 16.

A BSF layer 120 is deposited on top of the cell C, the BSF layer performing the same function as the BSF layers 109 and 114.

Finally a p+ contact layer 121 is deposited on the BSF layer 120.

It should be apparent to one skilled in the art, that additional layer(s) may be added or deleted in the cell structure without departing from the scope of the present invention.

Figure 2:
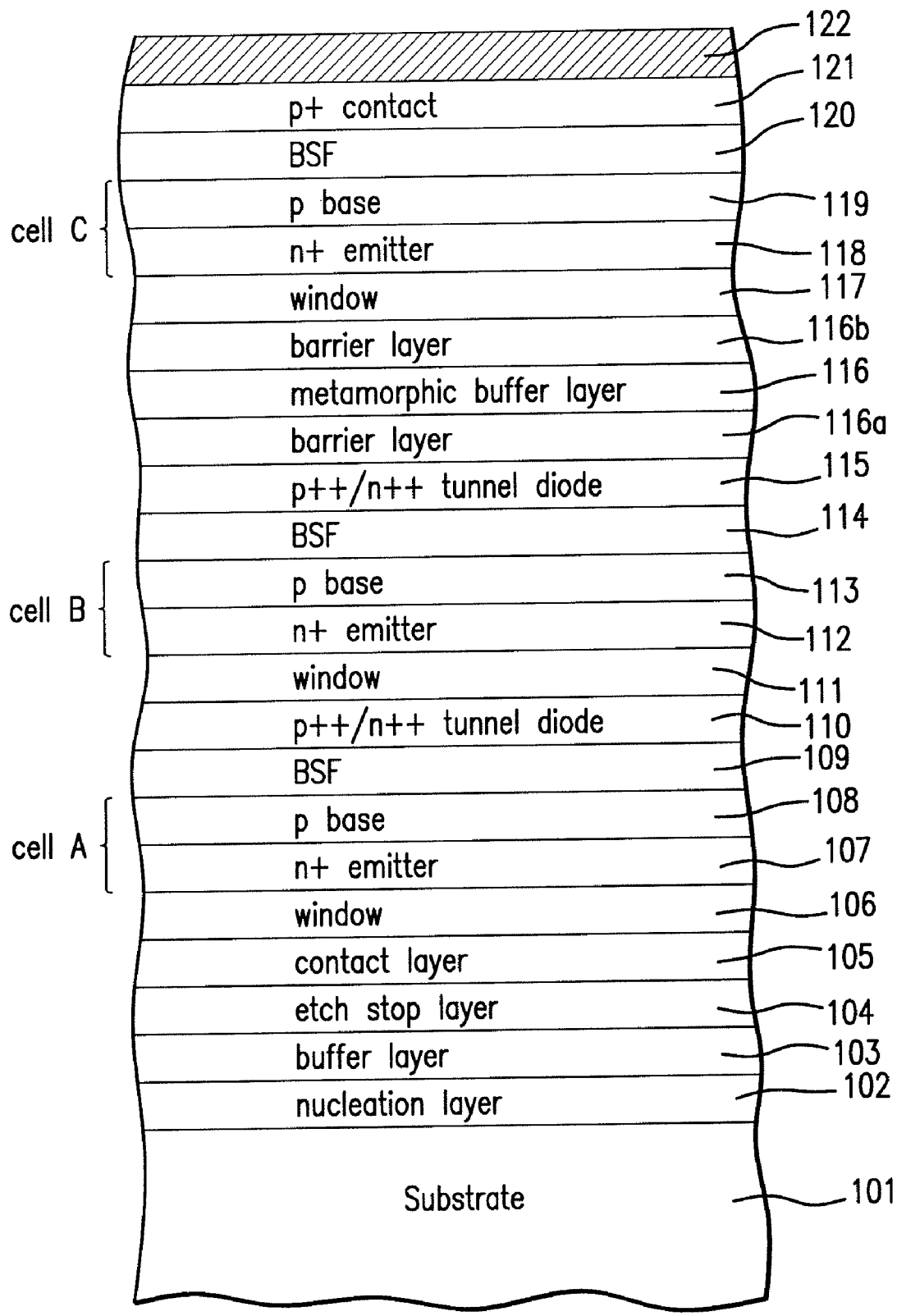
FIG. 2 is a cross-sectional view of the solar cell of FIG. 1 after the next process step.

FIG. 2 is a cross-sectional view of the solar cell of FIG. 1 after the next process step in which a metal contact layer 122 is deposited over the p+ semiconductor contact layer 121. The metal is preferably Ti/Au/Ag/Au.

Figure 3:
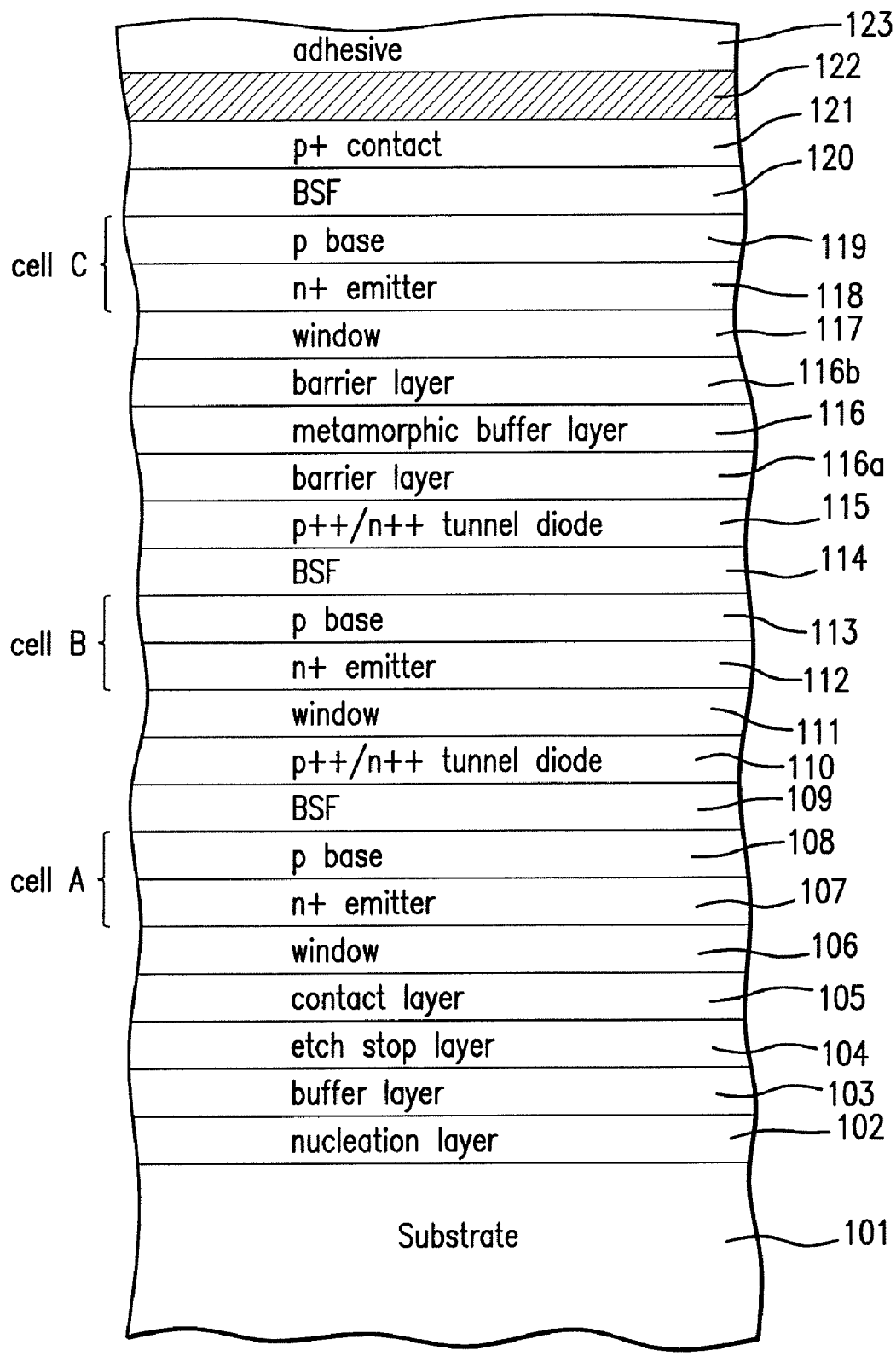
FIG. 3 is a cross-sectional view of the solar cell of FIG. 2 after the next process step.

FIG. 3 is a cross-sectional view of the solar cell of FIG. 2 after the next process step in which an adhesive layer 123 is deposited over the metal layer 122. The adhesive is preferably Wafer Bond (manufactured by Brewer Science, Inc. of Rolla, Mo.).

Figure 4:
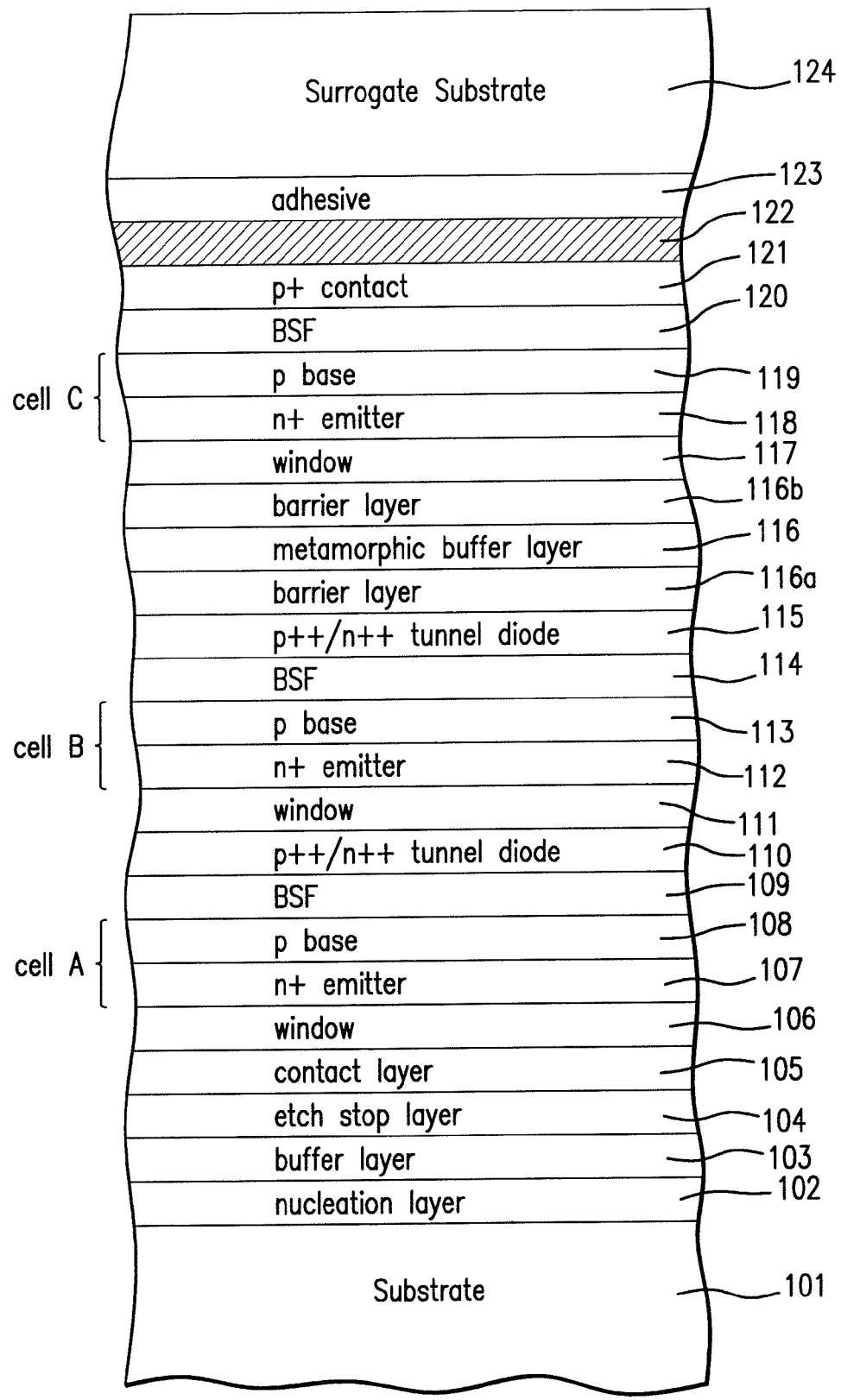
FIG. 4 is a cross-sectional view of the solar cell of FIG. 3 after the next process step.

FIG. 4 is a cross-sectional view of the solar cell of FIG. 3 after the next process step in which a surrogate substrate 124, preferably sapphire, is attached. The surrogate substrate is about 40 mils in thickness, and is perforated with holes about 1 mm in diameter, spaced 4 mm apart, to aid in subsequent removal of the adhesive and the substrate.

Figure 5A:
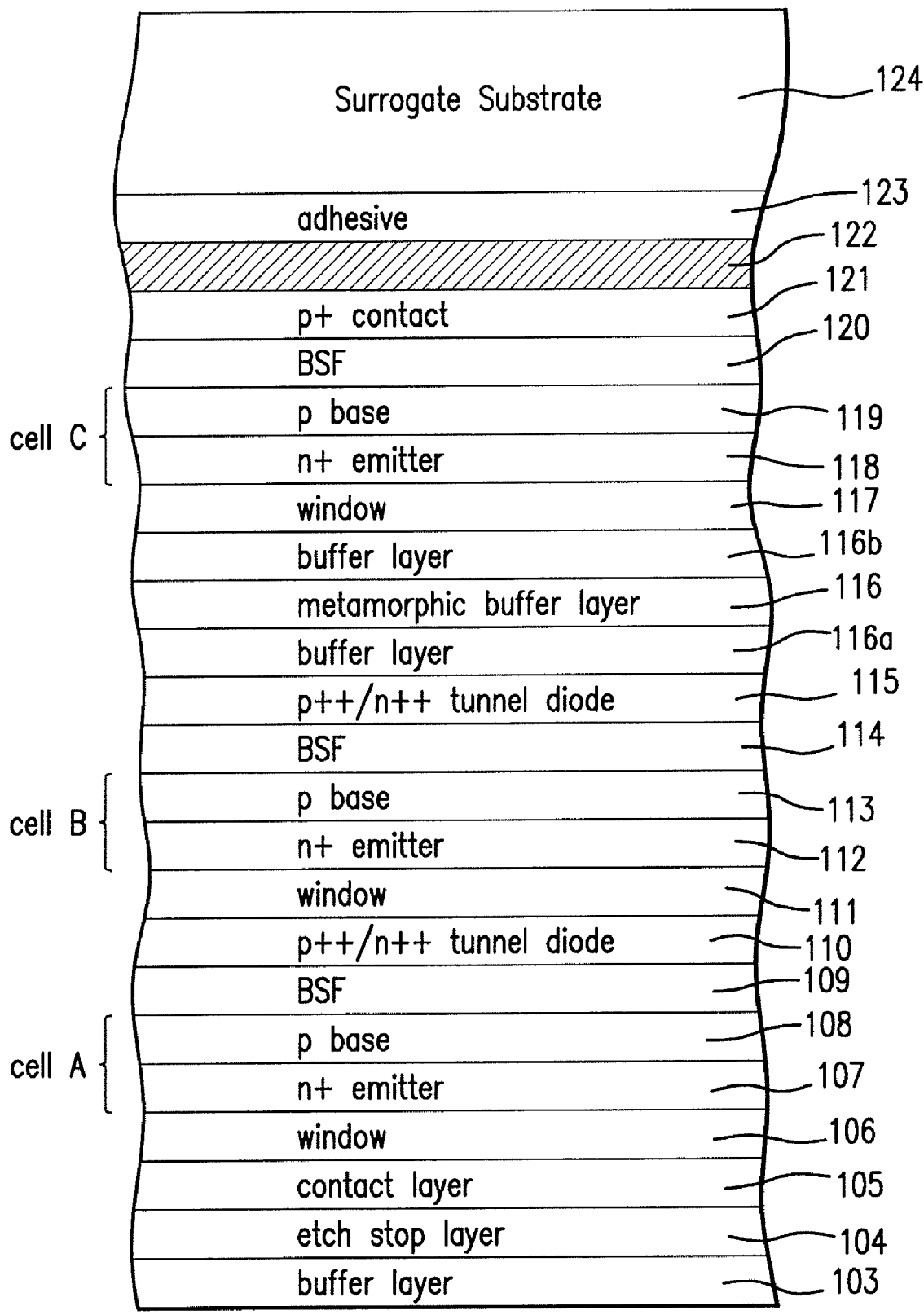
FIG. 5A is a cross-sectional view of the solar cell of FIG. 4 after the next process step in which the original substrate is removed.

FIG. 5A is a cross-sectional view of the solar cell of FIG. 4 after the next process step in which the original substrate is removed by a sequence of lapping and/or etching steps in which the substrate 101, the buffer layer 103, and the etch stop layer 104, are removed. The choice of a particular etchant is growth substrate dependent.

Figure 5B:
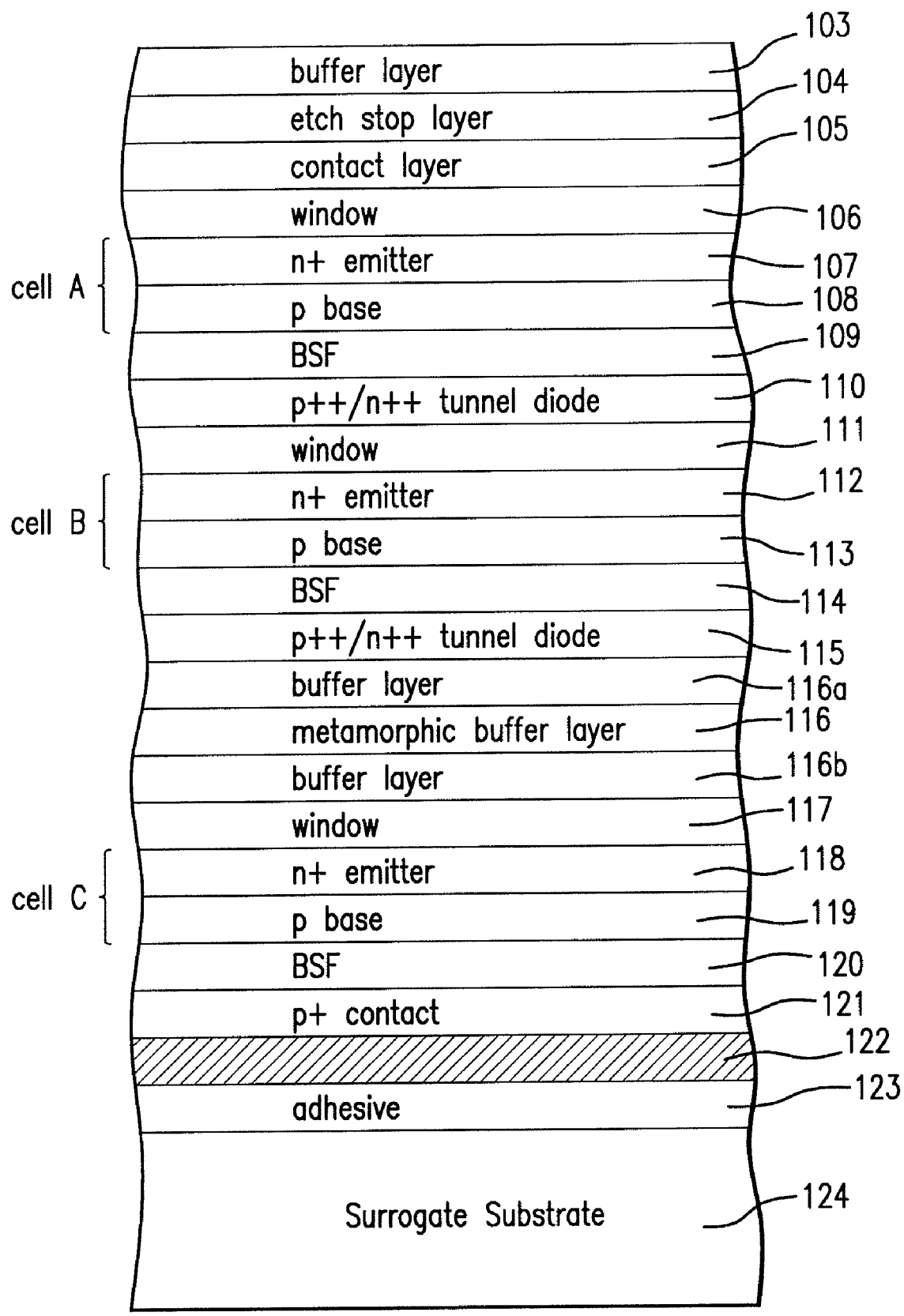
FIG. 5B is another cross-sectional view of the solar cell of FIG. 5A with the surrogate substrate on the bottom of the Figure.

FIG. 5B is a cross-sectional view of the solar cell of FIG. 5A with the orientation with the surrogate substrate 124 being at the bottom of the Figure. Subsequent Figures in this application will assume such orientation.

Figure 6A:
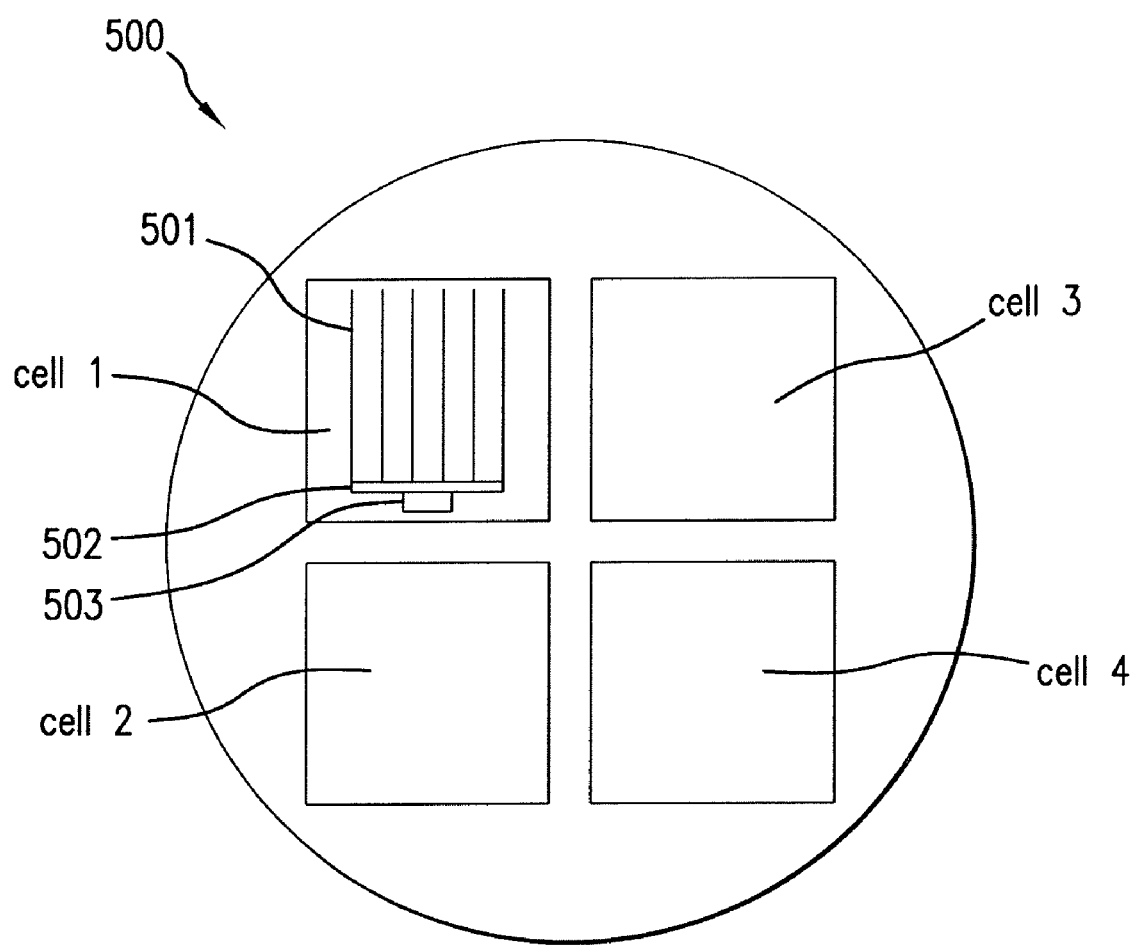
FIG. 6A is a top plan view of a wafer in which the solar cells are fabricated.

FIG. 6A is a top plan view of a wafer in which for solar cells are implemented. The depiction of four cells is for illustration for purposes only, and the present invention is not limited to any specific number of cells per wafer.

In each cell there are grid lines 501 (more particularly shown in cross-section in FIG. 10), an interconnecting bus line 502, and a contact pad 503. The geometry and number of grid and bus lines is illustrative and the present invention is not limited to the illustrated embodiment.

Figure 6B:
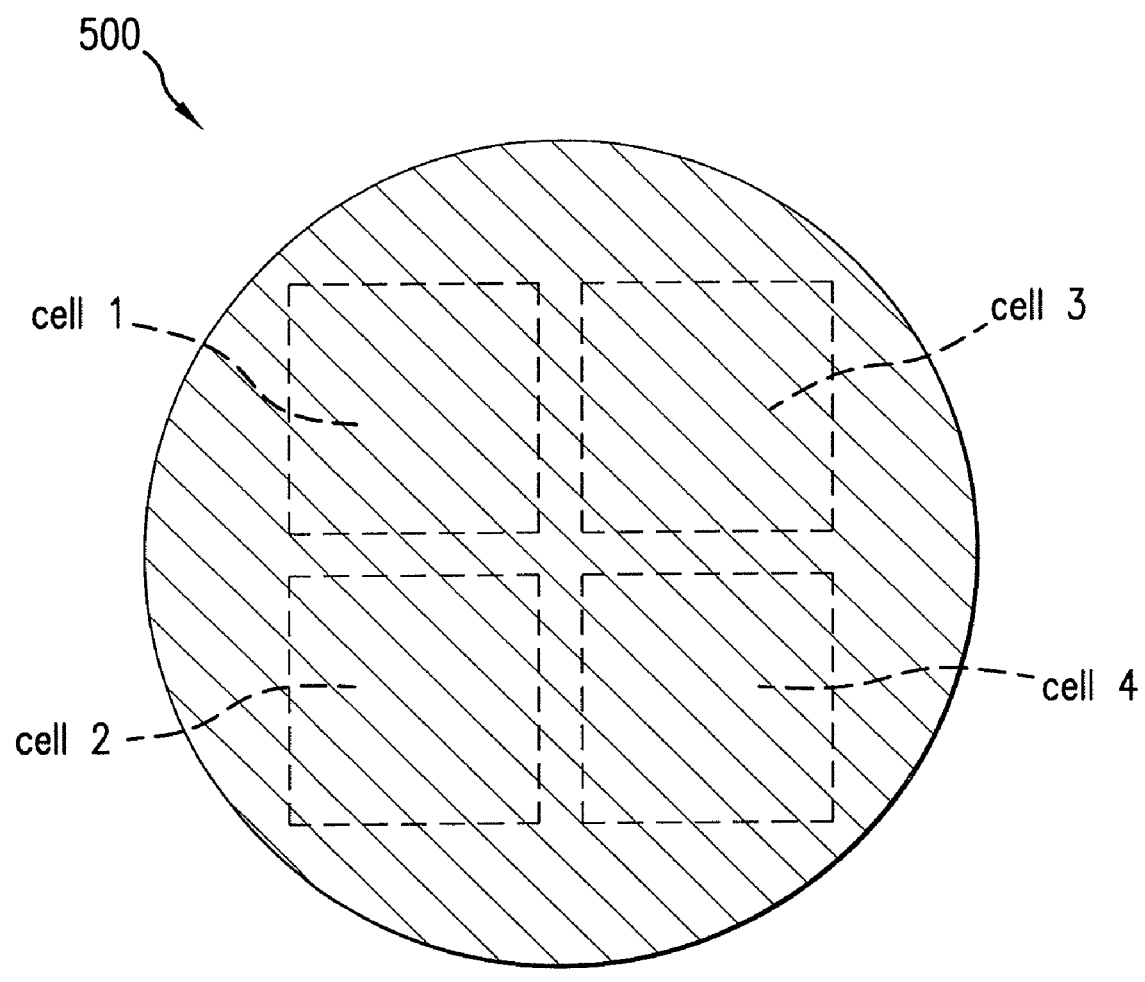
FIG. 6B is a bottom plan view of a wafer in which the solar cells are fabricated.

FIG. 6B is a bottom plan view of the wafer with four solar cells shown in FIG. 6A.

Figure 7:
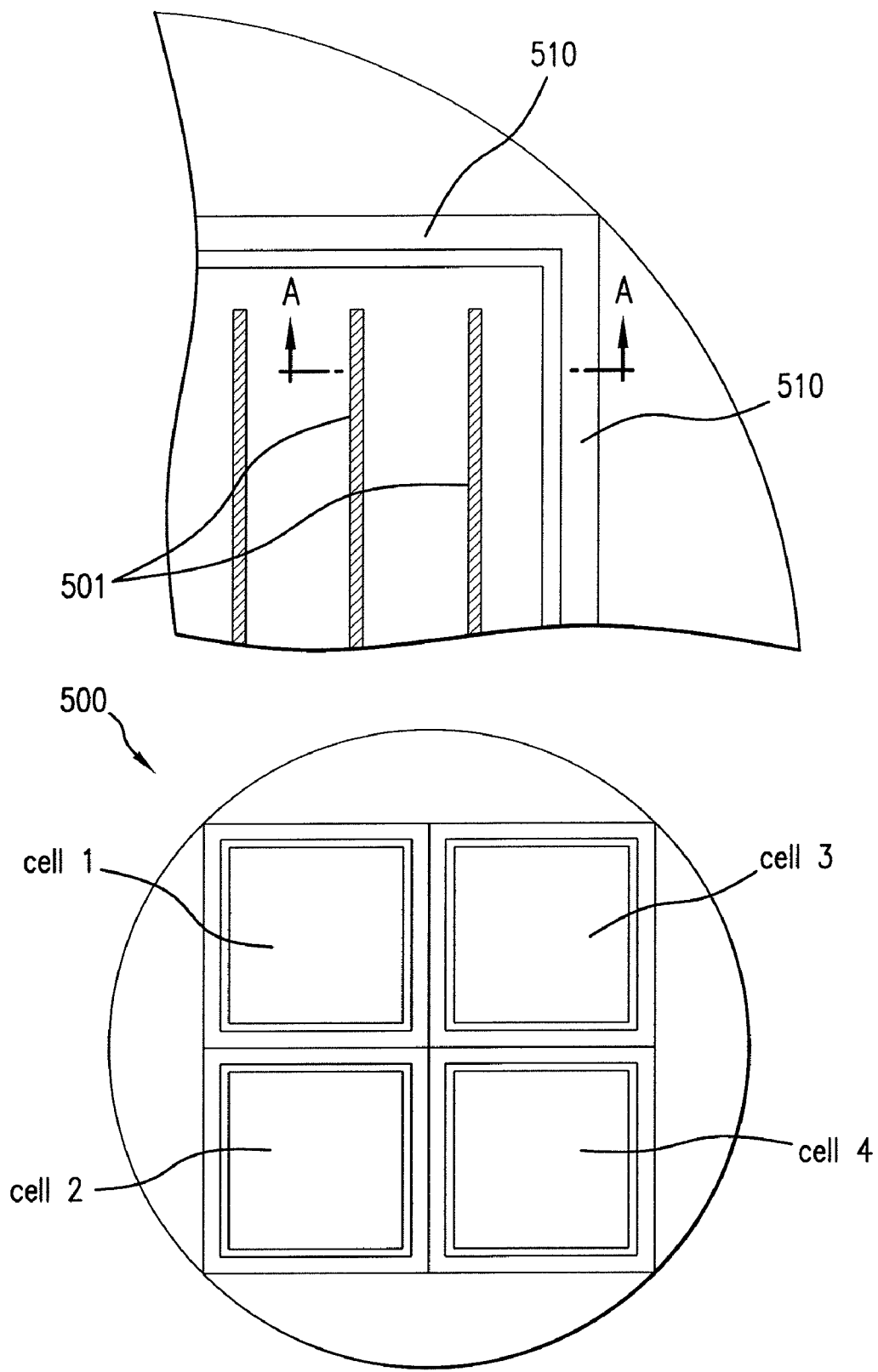
FIG. 7 is a top plan view of the wafer of FIG. 6A after the next process step.

FIG. 7 is a top plan view of the wafer of FIG. 6A after the next process step in which a mesa 510 is etched around the periphery of each cell using phosphide and arsenide etchants.

Figure 8:
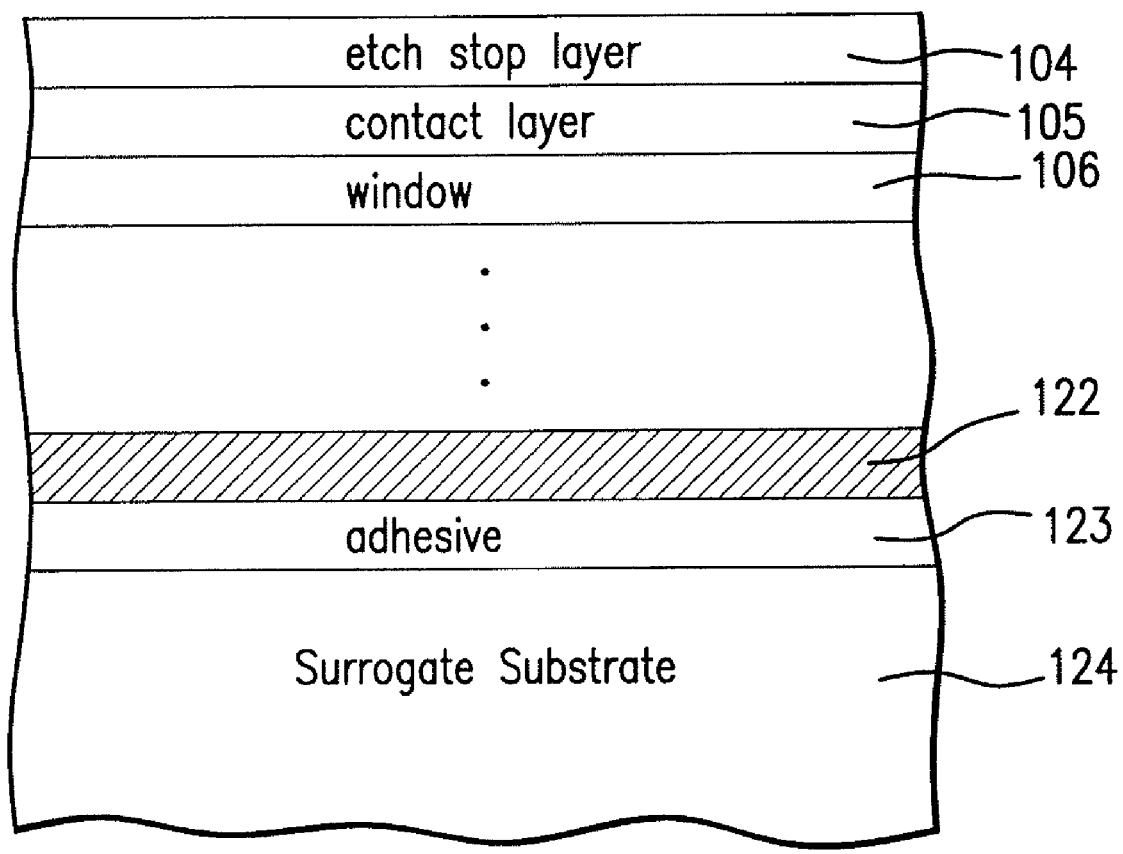
FIG. 8 is a cross-sectional view of the solar cell of FIG. 5B after the next process step.

FIG. 8 is a simplified cross-sectional view of the solar cell of FIG. 5B depicting just a few of the top layers and lower layers over the surrogate substrate 124.

Figure 9:
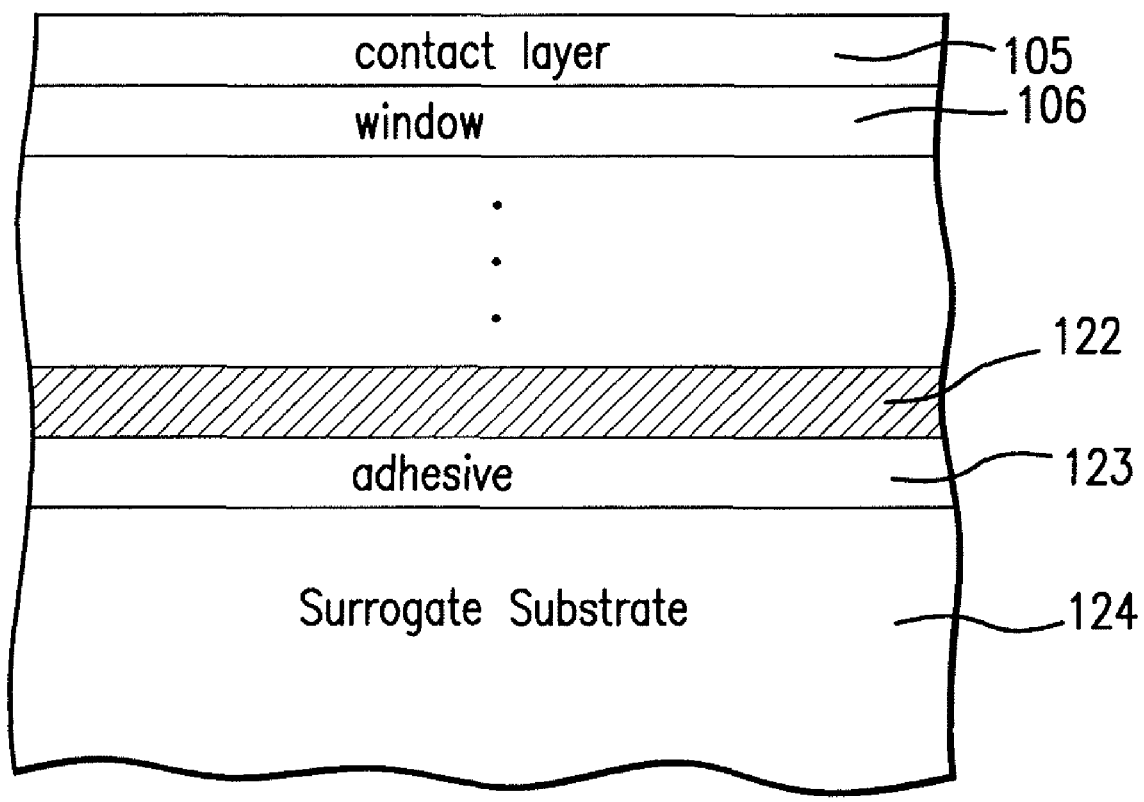
FIG. 9 is a cross-sectional view of the solar cell of FIG. 8 after the next process step.

FIG. 9 is a cross-sectional view of the solar cell of FIG. 8 after the next process step in which the etch stop layer 104 is removed by a HCl/H$_2$O solution.

Figure 10:
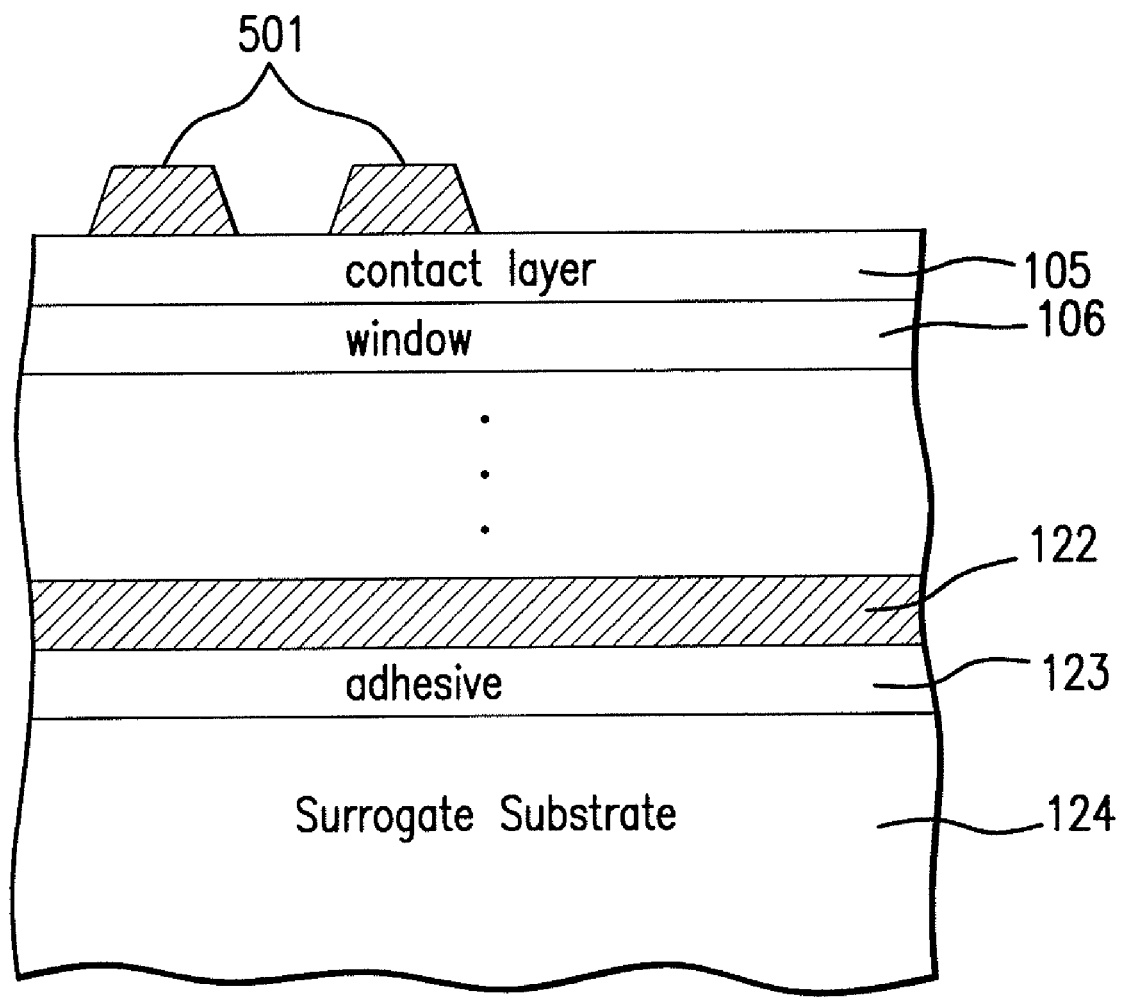
FIG. 10 is a cross-sectional view of the solar cell of FIG. 9 after the next process step.

FIG. 10 is a cross-sectional view of the solar cell of FIG. 9 after the next sequence of process steps in which a photoresist mask (not shown) is placed over the contact layer 105 to form the grid lines 501. The grid lines 501 are deposited via evaporation and lithographically patterned and deposited over the contact layer 105. The mask is lifted off to form the metal grid lines 501.

Figure 11:
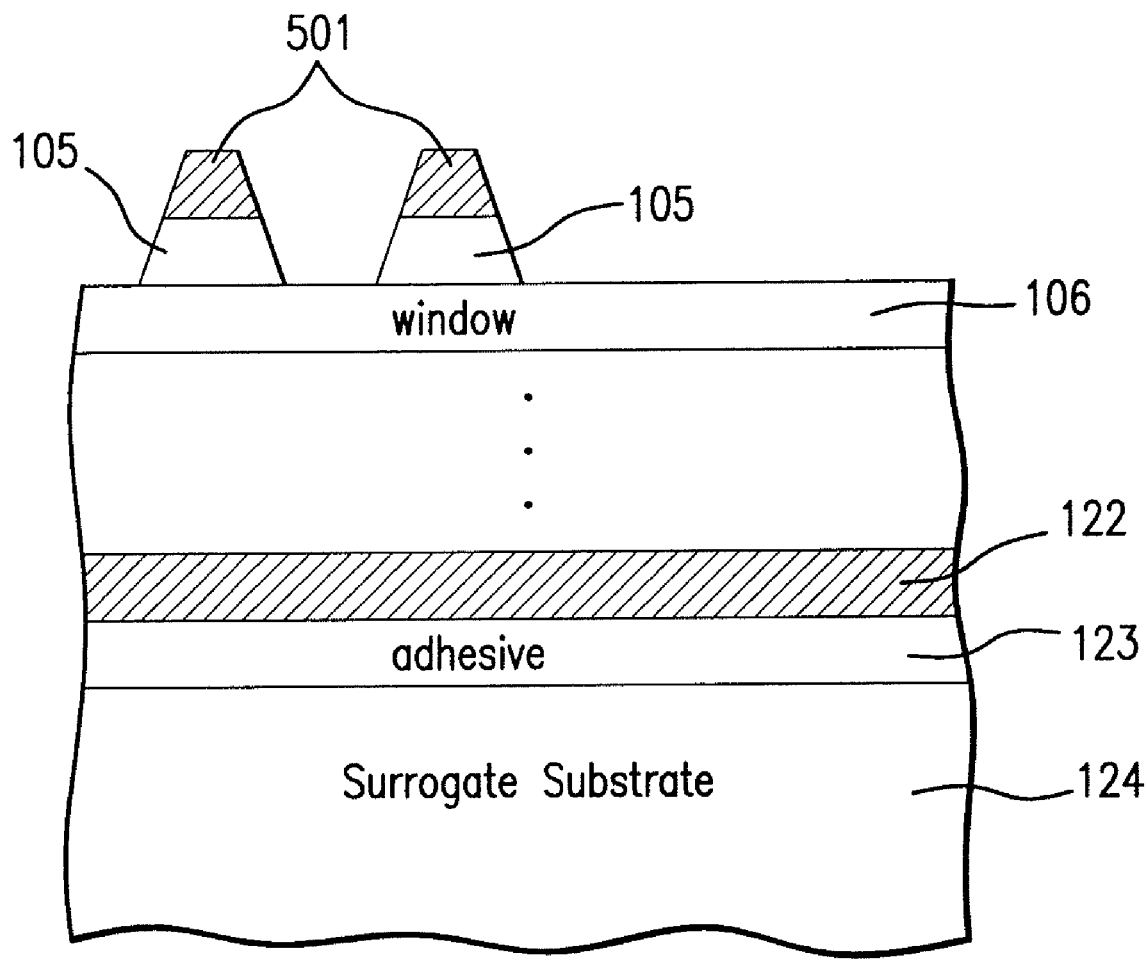
FIG. 11 is a cross-sectional view of the solar cell of FIG. 10 after the next process step.

FIG. 11 is a cross-sectional view of the solar cell of FIG. 10 after the next process step in which the grid lines are used as a mask to etch down the surface to the window layer 106 using a citric acid/peroxide etching mixture.

Figure 12:
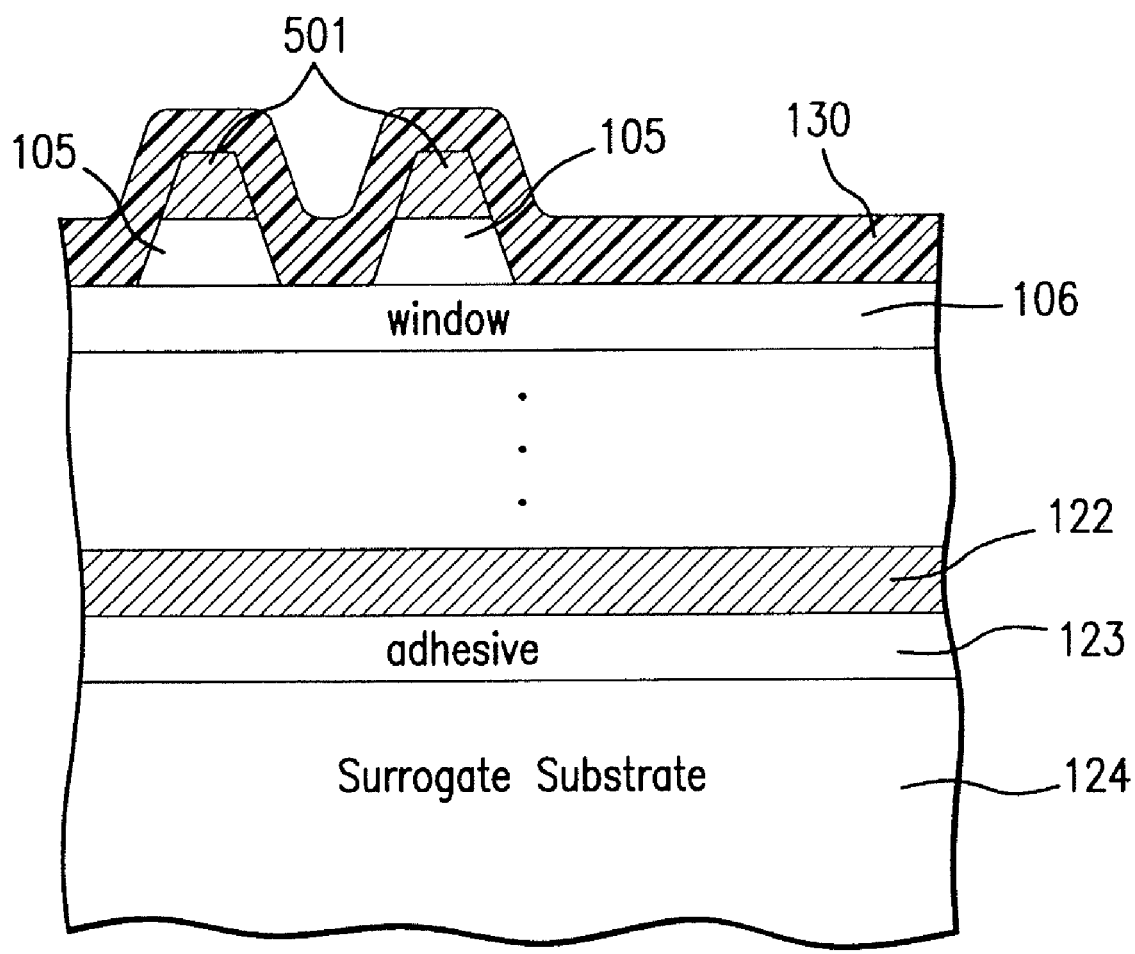
FIG. 12 is a cross-sectional view of the solar cell of FIG. 11 after the next process step.

FIG. 12 is a cross-sectional view of the solar cell of FIG. 11 after the next process step in which an antireflective (ARC) dielectric coating layer 130 is applied over the entire surface of the "bottom" side of the wafer with the grid lines 501.

Figure 13:
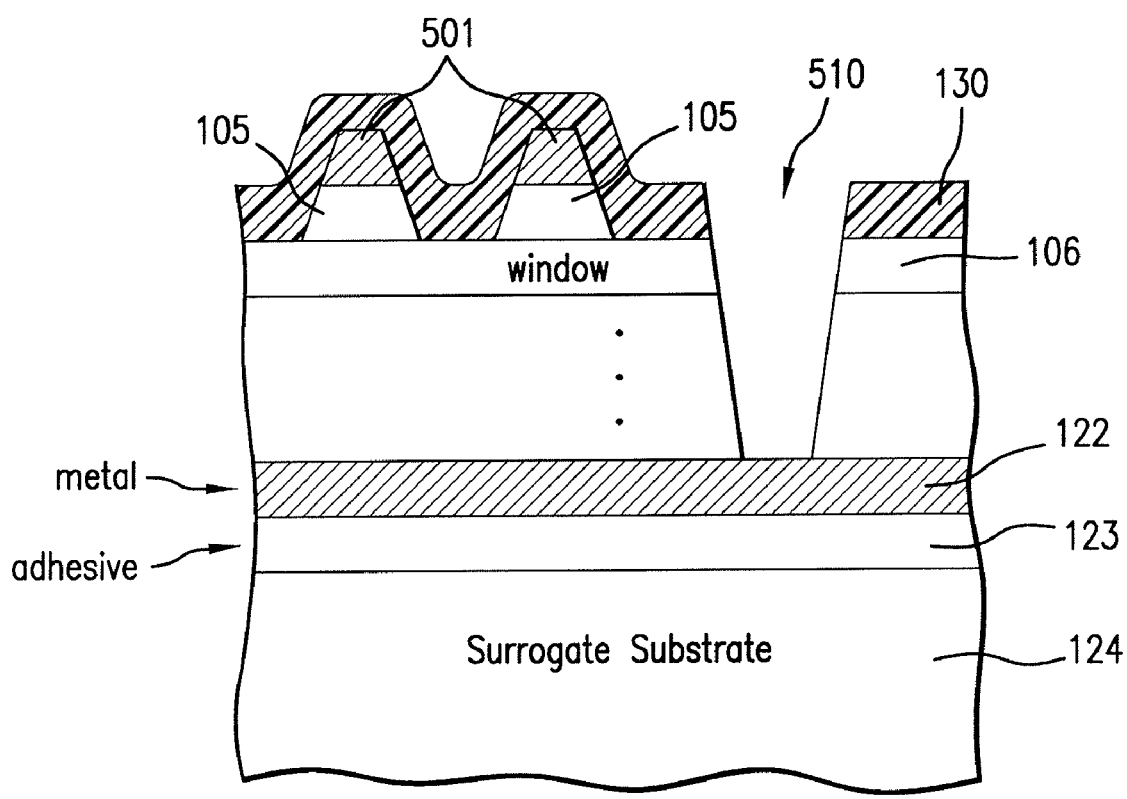
FIG. 13 is a cross-sectional view of the solar cell of FIG. 12 after the next process step.

FIG. 13 is a cross-sectional view of the solar cell of FIG. 12 after the next process step in which the mesa 510 is etched down to the metal layer 122 using phosphide and arsenide etchants. The cross-section in the figure is depicted as seen from the A-A plane shown in FIG. 7. One or more silver electrodes are then welded to the contact pad(s).

Figure 14:
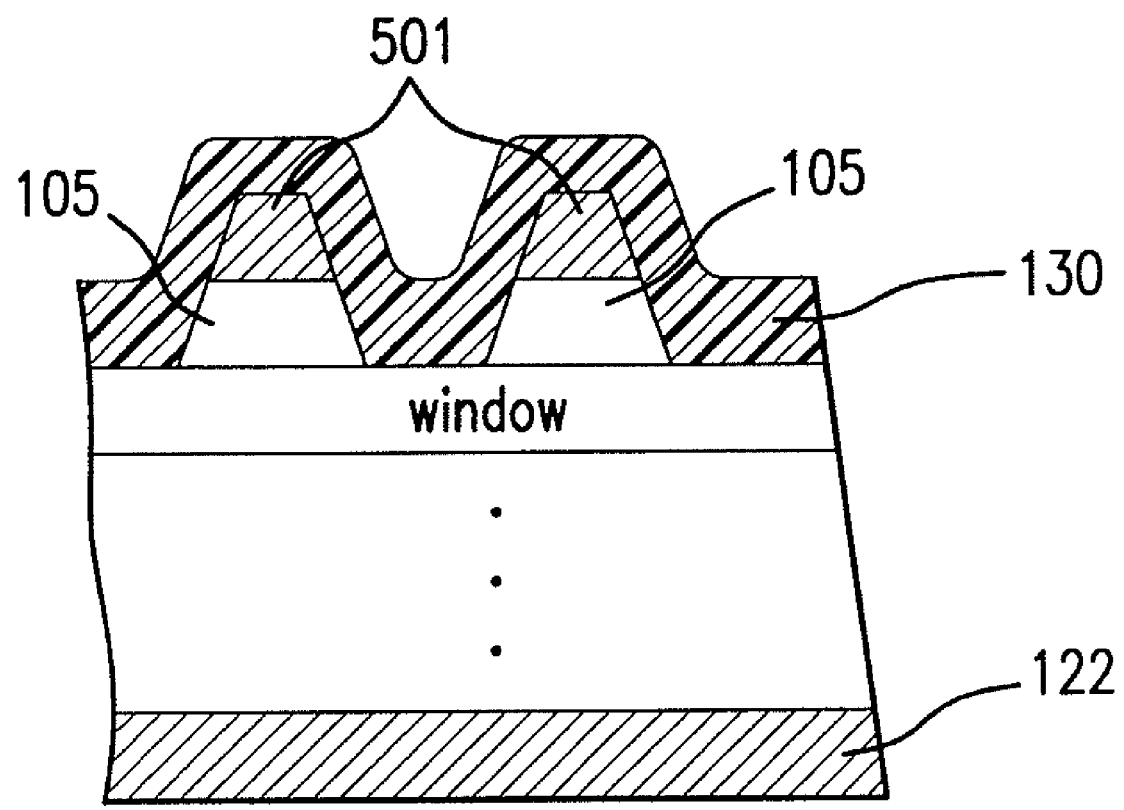
FIG. 14 is a cross-sectional view of the solar cell of FIG. 13 after the next process step.

FIG. 14 is a cross-sectional view of the solar cell of FIG. 13 after the next process step after the surrogate substrate 124 and adhesive 123 are removed by EKC 922. The preferred perforations provided in the surrogate substrate have a diameter of 0.033 inches, and are separated by 0.152 inches.

Figure 15:
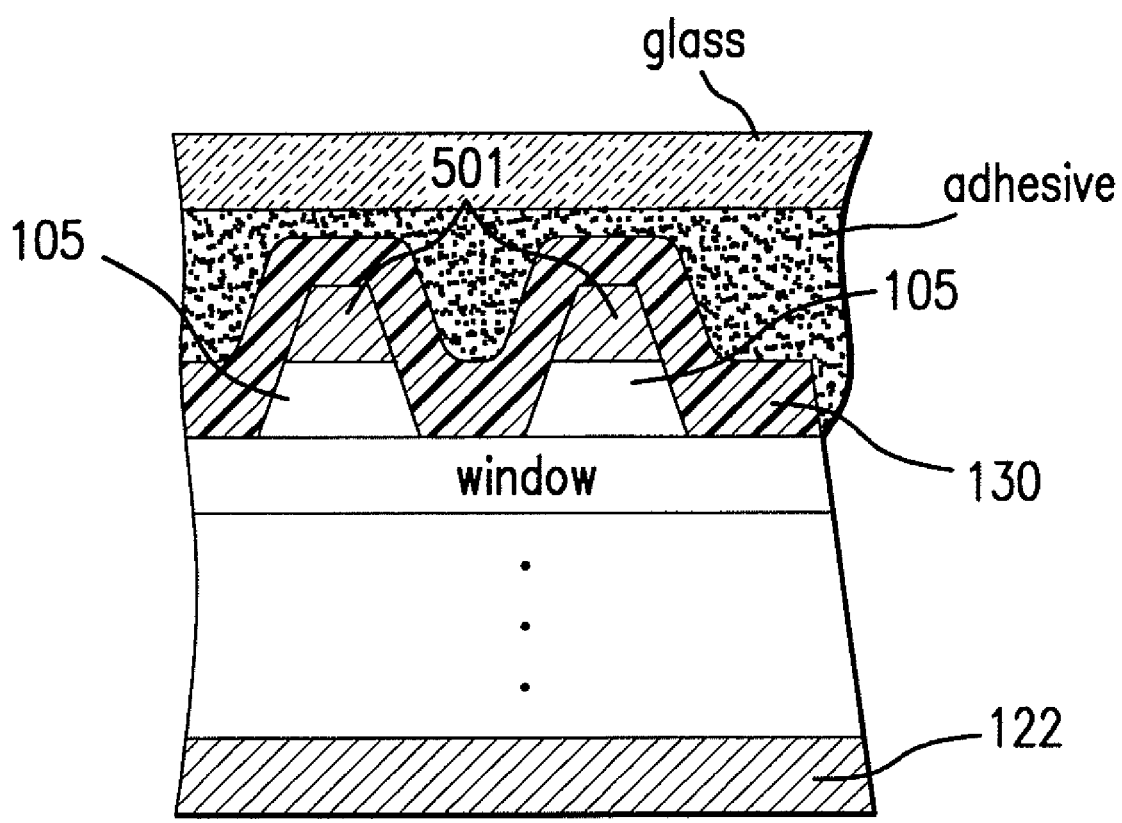
FIG. 15 is a cross-sectional view of the solar cell of FIG. 14 after the next process step.

FIG. 15 is a cross-sectional view of the solar cell of FIG. 14 In one embodiment after the next process step in which an adhesive is applied over the ARC layer 130 and a rigid coverglass attached thereto.

In a different embodiment, the solar cell of FIG. 13 may be initially mounted on a support, and the surrogate substrate 124 and adhesive 123 subsequently removed. Such a support may be the rigid coverglass mounted by an adhesive, as depicted in FIG. 15.

Figure 16:
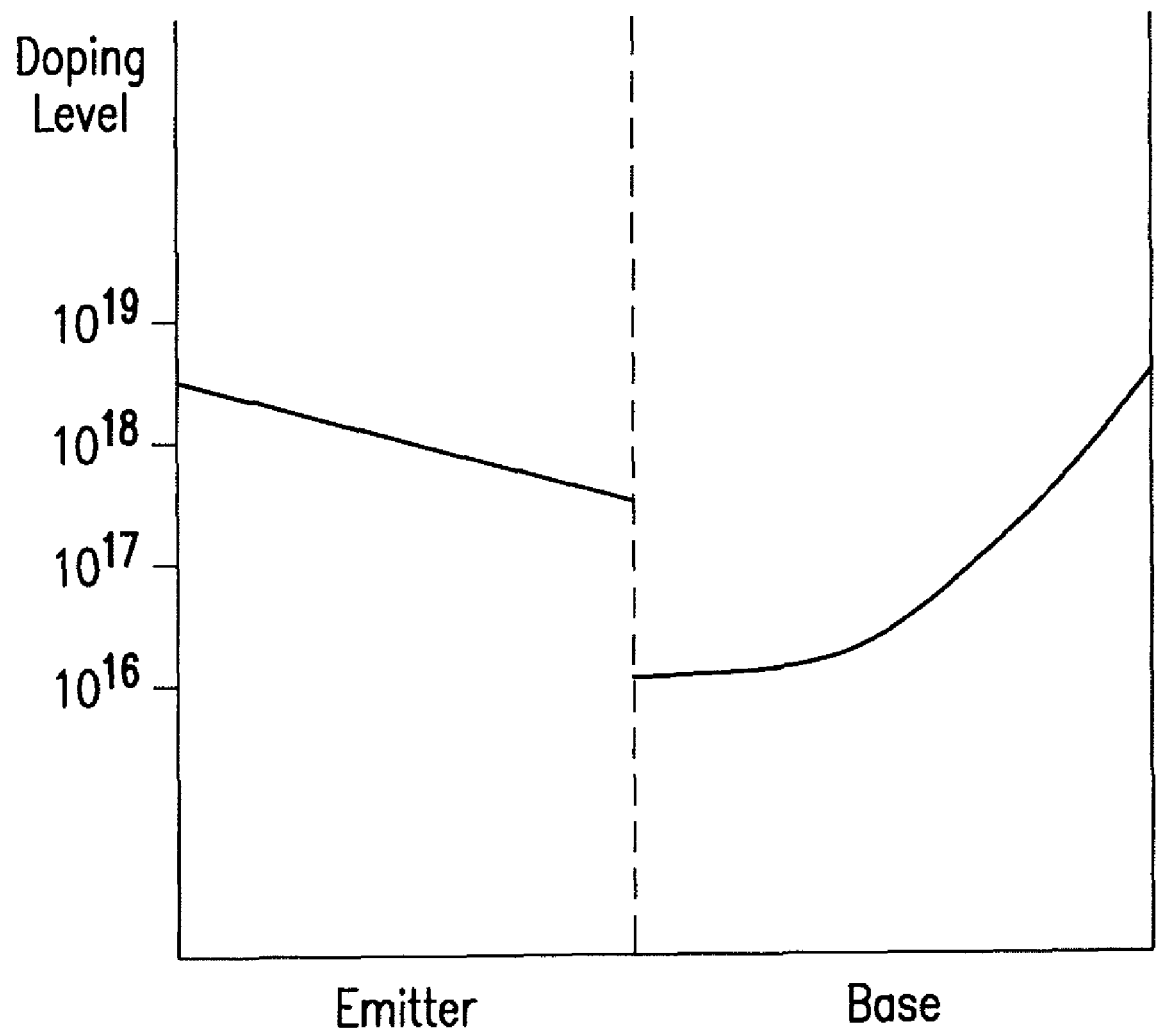
FIG. 16 is a graph of the doping profile between the emitter and base layer in a subcell of the inverted metamorphic solar cell according to one embodiment of the present invention.

FIG. 16 is a graph of the doping profile between the emitter and base layer in a subcell of a metamorphic solar cell according to the present invention in a first embodiment.

As noted above, the doping profile of the emitter and base layers depicted in FIG. 16 may be implemented in any one or more of the subcells of the triple junction solar cell of the present invention.

The specific doping profile according to one embodiment of the present invention is illustrated in the Figure: the emitter doping decreases from approximately $5 \times 10^{18}$ per cubic centimeter in the region immediately adjacent the adjoining layer (e.g. layers 106, 111, or 117) to $5 \times 10^{17}$ per cubic centimeter in the region adjacent the p-n junction shown by the dotted line in FIG. 16. The base doping increases exponentially from $1 \times 10^{16}$ per cubic centimeter adjacent the p-n junction to $1 \times 10^{18}$ per cubic centimeter adjacent the adjoining layer (e.g., layer 109, 114, or 120).

The absolute value of the collection field generated by an exponential doping gradient $\exp[-x/\lambda]$ is given by the constant electric field of magnitude $E=(kT/q(1/\lambda))(\exp[-\chi_b/\lambda])$, where k is the Boltzmann constant, T is the absolute temperature in degrees Kelvin, q is the absolute value of electronic charge, and $\lambda$ is a parameter characteristic of the doping decay.

The efficacy of an embodiment of the present invention has been demonstrated in a test solar cell which incorporated an exponential doping profile in the 3 μm thick base layer of the bottom subcell, according to one embodiment of the present invention. Following measurements of the electrical parameters of the test cell, there was observed a 6.7% increase in current collection. The measurements indicated an open circuit voltage ($V_{oc}$) equal to at least 3.014V, a short circuit current ($J_{sc}$) of at least 16.55 mA/cm$^2$, and a fill factor (FF) of at least 0.86 at AMO.

The exponential doping profile taught by the present invention produces a constant field in the doped region. In the particular triple junction solar cell materials and structure of the present invention, the bottom cell has the smallest short circuit current among all the subcells. In a triple junction solar cell, the individual subcells are stacked and form a series circuit. The total current flow in the entire cell is therefore limited by the smallest current produced in any one of the subcells. Thus, by increasing the short circuit current in the bottom cell by 6.7%, the current more closely approximates that of the higher subcells, and the overall efficiency of the triple junction solar cell is increased by 6.7% as well. In a solar triple junction cell with approximately 30% efficiency, the implementation of the present invention would increase efficiency by a factor of 1.067, i.e. to 32.01%. Such an increase in overall efficiency is substantial in the field of solar cell technology. In addition to an increase in efficiency, the collection field created by the exponential doping profile will enhance the radiation hardness of the solar cell, which is important for spacecraft applications.

Although the exponentially doped profile is the doping design which has been implemented and verified, other doping profiles may give rise to a linear varying collection field which may offer yet other advantages. For example, a doping profile of $e^{-x^2/\lambda^2}$ produces a linear field in the doped region which would be advantageous for both minority carrier collection and for radiation hardness at the end-of-life of the solar cell. Such other doping profiles in one or more base layer are within the scope of the present invention.

The doping profiles depicted herein are merely illustrative, and other more complex profiles may be utilized as would be apparent to those skilled in the art without departing from the scope of the present invention.

It will be understood that each of the elements described above, or two or more together, also may find a useful application in other types of constructions differing from the types of constructions differing from the types described above.

While the invention has been illustrated and described as embodied in a inverted metamorphic multifunction solar cell, it is not intended to be limited to the details shown, since various modifications and structural changes may be made without departing in any way from the spirit of the present invention.

Without further analysis, from the foregoing others can, by applying current knowledge, readily adapt the present invention for various applications. Such adaptations should and are intended to be comprehended within the meaning and range of equivalence of the following claims.

The invention claimed is:

1. A method of forming a multijunction solar cell comprising an upper subcell, a middle subcell, and a lower or bottom subcell, the method comprising:
    providing a first substrate for an epitaxial growth of a semiconductor material;
    forming a first solar subcell having a first base and a first emitter on said substrate, wherein said first solar subcell has a first band gap;
    forming a second solar subcell having a second base and a second emitter over said first solar subcell, wherein said second solar subcell has a second band gap smaller than said first band gap;
    forming a grading interlayer over said second solar subcell, said grading interlayer having a third band gap greater than said second band gap; and
    forming a third solar subcell having a third base and a third emitter over said grading interlayer, said third solar subcell having a fourth band gap smaller than said second band gap such that said third solar subcell is lattice mis-matched with respect to said second solar subcell,
    wherein at least one of the bases has an exponentially doped profile.

2. A method as defined in claim 1, wherein the first base in said first solar subcell has an exponential gradation in doping from $1\times10^{16}$ per cubic centimeter adjacent the first-base-first-emitter junction to $1\times10^{18}$ per cubic centimeter adjacent the adjoining layer.

3. A method as defined in claim 1, wherein the second base in said second solar subcell has an exponential gradation in doping from $1\times10^{16}$ per cubic centimeter adjacent the second-base-second-emitter junction to $1\times10^{18}$ per cubic centimeter adjacent the adjoining layer.

4. A method as defined in claim 1, wherein the third base in said third solar subcell has an exponential gradation in doping from $1\times10^{16}$ per cubic centimeter adjacent the third-base-third-emitter junction to $1\times10^{18}$ per cubic centimeter adjacent the adjoining layer.

5. A method as defined in claim 4, wherein said third solar subcell is the bottom subcell and the exponential gradation in doping results in radiation hardness at end-of-life of the solar cell.

6. A method as defined in claim 1, wherein one of first, second and third emitters has an increasing gradation in doping from $5\times10^{17}$ per cubic centimeter adjacent the base-emitter junction to $5\times10^{18}$ per cubic centimeter adjacent the adjoining layer.

7. A method as defined in claim 1, wherein said first substrate is composed of GaAs.

8. A method as defined in claim 1, wherein said first solar subcell is composed of an InGa(Al)P emitter region and an InGa(Al)P base region.

9. A method as defined in claim 1, wherein said second solar subcell is composed of an InGaP emitter region and an GaAs base region.

10. A method as defined in claim 1, wherein said grading interlayer is composed of InGaAlAs.

11. A method as defined in claim 10, wherein said grading interlayer is composed of nine steps of layers with monotonically changing lattice constant.

12. A method as defined in claim 1, wherein said third solar subcell is composed of InGaAs.

13. A method as defined in claim 1, further comprising depositing a barrier layer about one micron in thickness adjacent said grading interlayer for preventing threading dislocations from propagating.

14. A method of forming a multijunction solar cell comprising an upper subcell, a middle subcell, and a lower or bottom subcell, the method comprising:

providing a first substrate for an epitaxial growth of a semiconductor material;

forming a first solar subcell having a first base and a first emitter on said substrate, wherein said first solar subcell has a first band gap with the first base in said first solar subcell having an exponential gradation in doping from $1\times10^{16}$ per cubic centimeter in a region adjacent to the first-base-first-emitter junction to $1\times10^{18}$ per cubic centimeter in a region adjacent to an adjoining layer formed adjacent the first base;

forming a second solar subcell having a second base and a second emitter over said first solar subcell, wherein said second solar subcell has a second band gap smaller than said first band gap; and forming a third solar subcell having a third base and a third emitter over said second solar subcell, wherein said third solar subcell has a third band gap smaller than said second band gap.

15. A method as defined in claim 14, wherein one of the first, second and third emitters has an increasing gradation in doping from $5\times10^{17}$ per cubic centimeter adjacent the base-emitter junction to $5\times10^{18}$ per cubic centimeter adjacent the adjoining layer.

16. A method as defined in claim 14, wherein said second solar subcell is composed of an InGaP emitter region and a GaAs base region.

* * * * *

UNITED STATES PATENT AND TRADEMARK OFFICE
CERTIFICATE OF CORRECTION

PATENT NO. : 7,727,795 B2  Page 1 of 1
APPLICATION NO. : 12/187454
DATED : June 1, 2010
INVENTOR(S) : Mark A. Stan, Arthur Cornfeld and Vance Ley It is certified that error appears in the above-identified patent and that said Letters Patent is hereby corrected as shown below:

Title Page, Item (73) Assignee change "Encore Solar Power, Inc." to --Emcore Solar Power, Inc.--.

Title Page, Item (57) Abstract, line 12, change "mis-matched" to --mismatched--.

Column 1, line 14, change "Aug. 8, 2007" to --Aug. 9, 2007--; line 30, change "multifunction" to --multijunction--.

Column 2, line 7, change "multifunction" to --multijunction--; line 42, change "A" to --a--.

Column 4, line 9, change "(T)" to --(TI)--.

Column 5, line 1, change "ev" to --eV--; line 24, delete "an"; line 61, change "for" to --four--; line 63, delete "for".

Column 6, line 41, change "In" to --in--.

Column 7, line 57, change "a" to --an--; change "multifunction" to --multijunction--.

Signed and Sealed this

Twenty-third Day of November, 2010

David J. Kappos
*Director of the United States Patent and Trademark Office*